United States Patent
Kimura et al.

(10) Patent No.: US 7,116,692 B2
(45) Date of Patent: Oct. 3, 2006

(54) SEMICONDUCTOR LASER AND METHOD OF PRODUCING THE SAME

(75) Inventors: Takashi Kimura, Kyoto (JP); Hisayoshi Kitajima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 282 days.

(21) Appl. No.: 10/315,191

(22) Filed: Dec. 10, 2002

(65) Prior Publication Data

US 2003/0133484 A1 Jul. 17, 2003

(30) Foreign Application Priority Data

Dec. 11, 2001 (JP) ........................ 2001-377444
Dec. 11, 2001 (JP) ........................ 2001-377445

(51) Int. Cl.
*H01S 5/00* (2006.01)

(52) U.S. Cl. ........................... 372/46; 372/50
(58) Field of Classification Search .......... 372/43–50, 372/75, 36, 92–97; 257/103
See application file for complete search history.

(56) References Cited

U.S. PATENT DOCUMENTS

| | | | | | |
|---|---|---|---|---|---|
| 5,282,218 | A | * | 1/1994 | Okajima et al. | 372/46 |
| 5,825,797 | A | * | 10/1998 | Nagai | 372/46 |
| 5,850,411 | A | * | 12/1998 | Major et al. | 372/45 |
| 6,256,330 | B1 | * | 7/2001 | LaComb | 372/46 |
| 6,373,874 | B1 | * | 4/2002 | Kidoguchi et al. | 372/45 |
| 6,426,967 | B1 | * | 7/2002 | Tanabe | 372/46.01 |
| 6,444,485 | B1 | * | 9/2002 | Kidoguchi et al. | 438/31 |

FOREIGN PATENT DOCUMENTS

JP 2000-22262 * 1/2000

* cited by examiner

*Primary Examiner*—Minsun Oh Harvey
*Assistant Examiner*—Tuan Nguyen
(74) *Attorney, Agent, or Firm*—Rabin & Berdo, P.C.

(57) ABSTRACT

A semiconductor laser device having a lower cladding layer, an active layer and an upper first cladding layer stacked on a compound semiconductor substrate in this order, a ridge-shaped upper second cladding layer provided on the upper first cladding layer, a current blocking layer provided on both sides of the upper second cladding layer, and a contact layer provided on the upper second cladding layer. A current interrupting layer or layers formed of an insulating material are provided between the upper second cladding layer and the contact layer, in the vicinity of at least one of a laser emission end face and a reflective end face, which are both end faces of the device in the longitudinal direction of the upper second cladding layer.

18 Claims, 8 Drawing Sheets

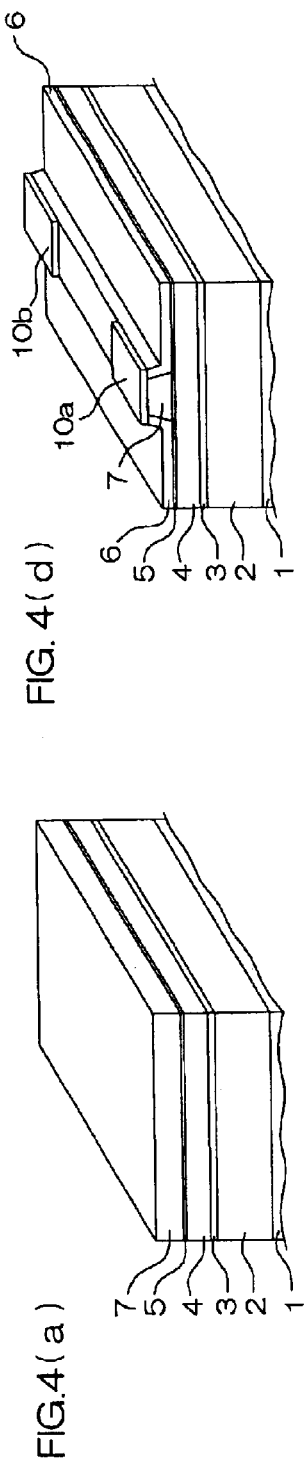
FIG. 4(a)
FIG. 4(b)
FIG. 4(c)
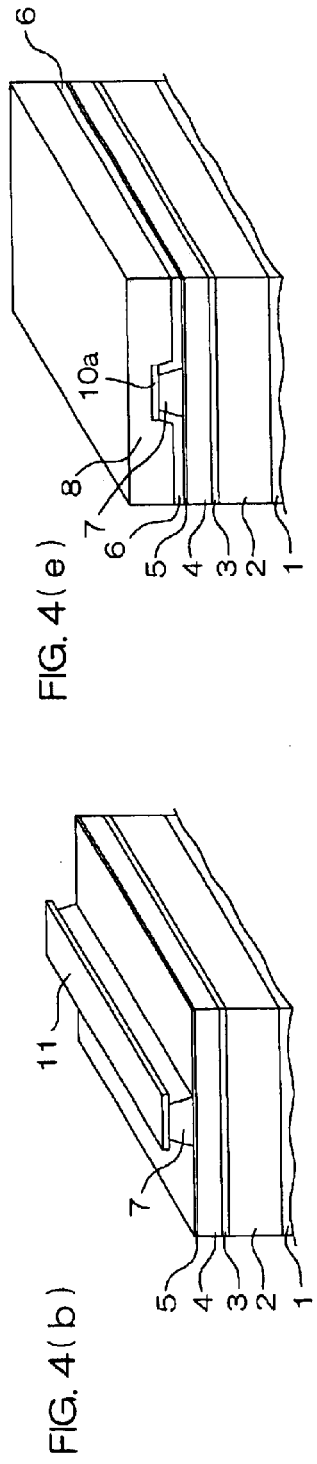
FIG. 4(d)
FIG. 4(e)

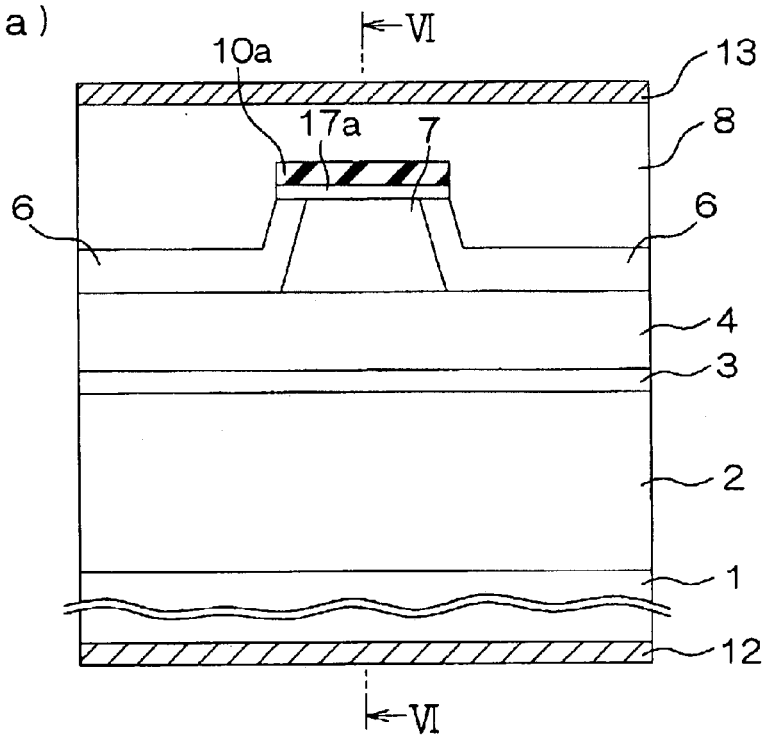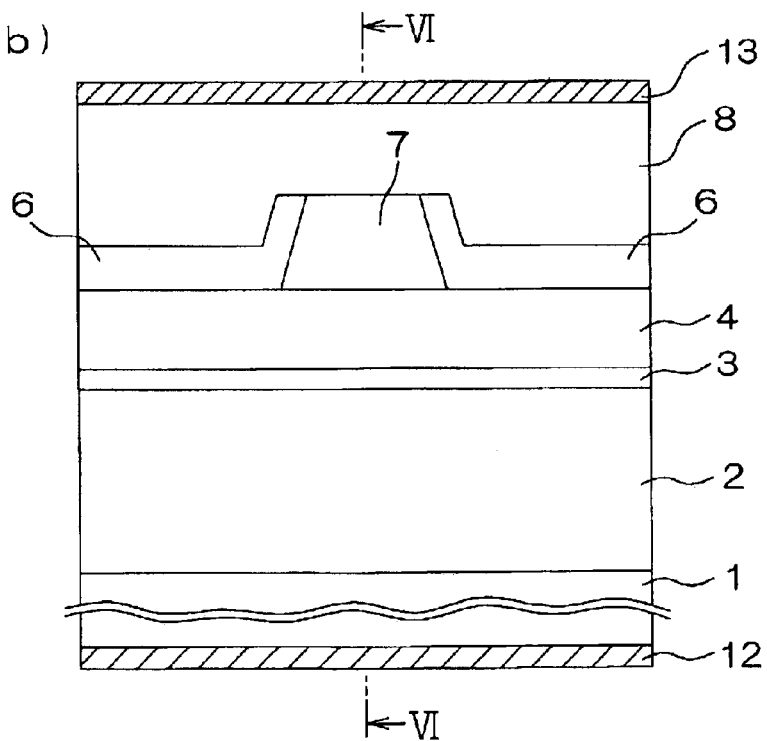

SEMICONDUCTOR LASER AND METHOD OF PRODUCING THE SAME

BACKGROUND OF THE INVENTION

1. Field of the Invention

The present invention relates to a semiconductor laser device used for optical disk apparatus such as a CD-R/RW drive, a DVD-RAM drive and the like, and to a method of producing the same.

2. Description of Related Art

It has been tried to increase the recording speed of optical recording apparatus, and, for example, CD-drives of 16-time speed recording have been put into practical use. In such optical recording apparatus of a high recording speed, it is necessary to momentarily start up high output laser light. As examples of lasers capable of fulfilling such required characters, there are ridge type semiconductor lasers produced by using compound semiconductors.

A semiconductor laser device is a light emitting device for inwardly reflecting light generated by recombination of electrons and holes at both of the end faces of the device, and thereby causing laser light oscillation. On both of the end faces of a semiconductor laser device, namely, a laser emission end face and a reflective end face, protective layers of alumina or the like are respectively formed for protecting the same.

However, in the process of producing a semiconductor laser device, the end faces of the device are oxidized, before the protective layers are formed, resulting in forming a number of non-radiative recombination centers on the laser emission end face and the reflective end face. At the time of laser light emission, current is injected throughout the length of the device from the laser emission end face to the reflective end face. At this time, on the laser emission end face and the reflective end face, non-radiative recombination occurs to cause heat generation. When band gap becomes small due to the heat generation, laser light absorption increases, further to cause a temperature rise. With this being repeated, so-called COD (Catastrophic Optical Damage) occurs to melt the end faces of the semiconductor laser device, so that the device is finally broken.

When the optical output of a semiconductor laser device is raised, COD occurs at a certain level (destructive optical output level). Therefore, when using a semiconductor laser device, the optical output thereof must be set lower than the destructive optical output level.

SUMMARY OF THE INVENTION

An object of the present invention is to provide a semiconductor laser device in which high optical output can be realized by raising the destructive optical output level, and a method for producing the same.

A semiconductor laser device according to a first aspect of the present invention includes a lower cladding layer, an active layer and an upper first cladding layer stacked on a compound semiconductor substrate in this order, a ridge-shaped upper second cladding layer provided on the upper first cladding layer, a current blocking layer provided on both sides of the upper second cladding layer, a contact layer provided on the upper second cladding layer, and a current interrupting layer or current interrupting layers formed of an insulating material and provided between the upper second cladding layer and the contact layer, in the vicinity of at least one of a laser emission end face and a reflective end face, which are both end faces of the device in the longitudinal direction of the upper second cladding layer.

According to the present invention, since the current interrupting layers (or layer) are provided, current hardly flows in the vicinity of the laser emission end face and (or) in the vicinity of the reflective end face. Therefore, non-radiative recombination can be restrained, and temperature rise at the end face(s) can be controlled. As a result, the destructive optical output level of a semiconductor laser device can be raised, and thereby a high output semiconductor laser device can be realized.

It is possible to provide both or either one of the current interrupting layer in the vicinity of the laser emission end face and the current interrupting layer in the vicinity of the reflective end face. Further, when both of the current interrupting layers in the vicinity of the laser emission end face and in the vicinity of the reflective end face are provided, the lengths of the two current interrupting layers in the longitudinal direction of the device may be equal or different. Since heat emission due to non-radiative recombination occurs remarkably in the vicinity of the laser emission end face, it is possible to make the current interrupting layer in the vicinity of the laser emission end face longer than the that in the vicinity of the reflective end face, or to provide only the current interrupting layer in the vicinity of the laser emission end face.

The current interrupting layer is preferably formed of silicon oxide, silicon nitride or aluminum oxide. Thereby, the current interrupting layer can suitably interrupt current.

A method of producing a semiconductor laser device according to the present invention includes a step of stacking a lower cladding layer, an active layer, an upper first cladding layer and an upper second cladding layer on a compound semiconductor substrate in this order, a step of forming a strip-shaped mask layer of an insulating material on the upper second cladding layer, a step of re-forming the upper second cladding layer into a ridge shape using the mask layer, a step of making a current blocking layer selectively grow on both sides of the ridge-shaped upper second cladding layer, a step of removing the mask layer with at least a portion in the vicinity of one end thereof in the longitudinal direction of the mask layer being left, and a step of forming, on the upper second cladding layer, a contact layer which is in ohmic contact with the upper second cladding layer.

According to this producing method, a semiconductor laser device having the above-mentioned structure can be obtained. After removing the mask layer with at least a portion in the vicinity of the laser emission end face or the reflective end face being left, the remaining portion(s) of the mask layer constitutes the current interrupting layer(s).

The upper second cladding layer may be re-formed into a ridge shape by etching with using the mask layer as a mask. In such a case, it is possible to provide an etching stop layer having resistance to an etching medium so that the layers below the etching stop layer can be protected from etching.

The above-mentioned step of partly removing the mask layer may comprise forming resist on the portion(s) of the mask layer to be left, and then removing, by wet etching, the portion on which no resist is formed.

When the upper second cladding layer is re-formed into a ridge shape by etching, portions thereof below the end portions in the direction of the width of the mask layer are also removed. That is, the mask layer is in a state of protruding widthwise from the ridge-shaped upper second cladding layer. Then, the current blocking layer is formed on both sides of the upper second cladding layer, and the spaces below the protruding mask layer portions can be filled with the current blocking layer. When the mask layer is etched in this state, the mask layer is etched only from the upper surface, and therefore, only the portion having no resist thereon can be removed.

According to the conventional method of producing a ridge type semiconductor laser device, a mask layer is completely removed after a current blocking layer is formed on one side of an upper second cladding layer. However, according to the producing method of the present invention, a part of the mask layer is left as mentioned above, and the remaining portions constitute the current interrupting layers. Consequently, according to the producing method of the present invention, a high optical output semiconductor laser device having current interrupting layers can be obtained without largely increasing producing steps in comparison with those of the conventional method.

The mask layer is preferably formed of silicon oxide, silicon nitride or aluminum oxide.

When an AlGaAs based semiconductor laser device is produced by MOCVD (Metal-Organic Chemical Vapor Deposition) method, using a mask layer formed of silicon oxide can make a current blocking layer selectively grow on both sides of an upper second cladding layer. That is, the material constituting the current blocking layer does not stack on the mask layer.

A semiconductor laser device according to a second aspect of the present invention includes a lower cladding layer, an active layer and an upper first cladding layer stacked on a compound semiconductor substrate in this order, a ridge-shaped upper second cladding layer provided on the upper first cladding layer, a current blocking layer provided on both sides of the upper second cladding layer, a contact layer provided on the upper second cladding layer, and a zinc diffusion source layer or layers containing Zn provided in the vicinity of at least one of a laser emission end face and a reflective end face, which are both end faces of the device in the longitudinal direction of the device, and between the upper second cladding layer and the contact layer.

If a semiconductor laser device according to the present invention has been subjected to a suitably high temperature (for example, 500~600° C.) in the temperature experience thereof in the producing process, Zn is introduced into the active layer below the zinc diffusion source layer by zinc diffusion from the zinc diffusion source layer, so that the arrangement of the constituent atoms in the active layer is out of order, i.e. unregulated. If the active layer is an MQW (Multi Quantum Well) active layer, the arrangement of the constituent atoms in the alternately stacked layers having different compositions are unregulated, and the compositions thereof are homogenized. In a portion of the active layer in which Zn is not introduced, the arrangement of the constituent atoms is regulated. The band gap in the unregulated portions is larger than that in the regulated portion.

Therefore, in a semiconductor laser device according to the present invention, the active layer has larger and gap at least one of the portions in the vicinity of the laser emission end face and in the vicinity of the reflective end face than in the inner portion. In such portions having larger band gap, laser light absorption does not occur.

Further, if non-radiative recombination occurs at the laser emission end face or reflective end face and temperature becomes high to some extent to make band gap smaller, the band gap does not reach a level at which laser light absorption occurs. If there is no laser light absorption at the end face, COD does not occur. As a result, the destructive optical output level of the semiconductor laser device can be raised, and thereby a high optical output semiconductor laser device can be realized.

Since the zinc diffusion source layers are disposed near the active layer, Zn can be efficiently introduced into the active layer by diffusion. It is possible to provide both or either one of the zinc diffusion source layer in the vicinity of the laser emission end face and the zinc diffusion source layer in the vicinity of the reflective end face. The size (thickness, width and length in the longitudinal direction of the device) of each zinc diffusion source layer can be optionally selected as long as a predetermined portion or portions of the active layer are unregulated by zinc diffusion.

The zinc diffusion source layer is preferably formed of zinc oxide. When the zinc diffusion source layer is formed of zinc oxide, Zn can be easily diffused into the active layer by heating a specimen (compound semiconductor substrate on which the above-mentioned layers are stacked).

Further, the zinc diffusion source layer may be formed by doping Zn to an insulating material. In this case, by heating a specimen, Zn can be similarly easily diffused into the active layer.

By suitably selecting the doping amount of Zn to the insulating material, the Zn amount diffused into the active layer can be easily controlled. For example, when the whole of the zinc diffusion source layer is formed of ZnO, the Zn amount diffused into the active layer at the time of heating may become too large. In such a case, with the construction of the present invention, the Zn amount in the zinc diffusion source layer can be reduced, and the Zn amount diffused can be controlled. The insulating material may be silicon oxide, silicon nitride or the like.

Further, it is possible to additionally provide a current interrupting layer(s) of an insulating material formed between the zinc diffusion source layer and the contact layer, in the vicinity of at least one of the laser emission end face and the reflective end face which are both end faces of the device in the longitudinal direction of the upper second cladding layer. With this structure, due to the current interrupting layer as an insulator, current flowing through the laser emission end face and (or) the reflective end face can be reduced. Therefore, temperature rise at the end face(s) caused by non-radiative recombination can be restricted. As a result, it is possible to prevent the band gap at the end face(s) from becoming small.

Further, even if the band gap at the end faces becomes small, the band gap does not easily reach such a level as causing laser light absorption, since the initial band gap in these portions is large as above-mentioned. As a result, the destructive optical output level of the semiconductor laser device can be remarkably improved. Therefore, a high output semiconductor laser device can be realized.

The portions of the semiconductor laser devices according to the first and second aspects of the present invention may have the following compositions. That is, the compound semiconductor substrate can be formed of a GaAs compound semiconductor substrate. The lower cladding layer can be formed of an $Al_{x1}Ga_{(1-x1)}As$ layer.

The active layer can be formed of a single layer of $Al_{y1}Ga_{(1-y1)}As$, or a composite layer formed of $Al_{y11}Ga_{(1-y11)}As$ and $Al_{y12}Ga_{(1-y12)}As$, or a composite layer of $Al_{y1}Ga_{(1-y1)}As$ and GaAs. When the active layer is an MQW (Multi Quantum Well) active layer, the active layer may be the above-mentioned composite layer.

The upper first cladding layer can be formed of an $Al_{x2}Ga_{(1-x2)}As$ layer. The ridge-shaped upper second cladding layer can be formed of a $Al_{x3}Ga_{(1-x3)}As$ layer. The current blocking layer can be formed of an $Al_{y2}Ga_{(1-y2)}As$ layer or a composite layer including a lower layer of $Al_{y3}Ga_{(1-y3)}As$ disposed on the compound semiconductor substrate side and an upper layer of GaAs disposed on the contact layer side. The contact layer can be formed of a GaAs layer.

The portions of the semiconductor laser devices according to the first and second aspects of the present invention may also have the following compositions. That is, the compound semiconductor substrate can be formed of a GaAs compound semiconductor substrate. The lower cladding layer can be formed of an $In_{x1}(Ga_{y1}Al_{(1-y1)})_{(1-x1)}P$ layer.

The active layer can be formed of a single layer of $In_{x2}Ga_{(1-x2)}P$ layer, a composite layer of $In_{x3}Ga_{(1-x3)}P$ and $In_{x4}(Ga_{y4}Al_{(1-y4)})_{(1-x4)}P$, or a composite layer of $In_{x5}(Ga_{y5}Al_{(1-y5)})_{(1-x5)}P$ and $In_{x6}(Ga_{y6}Al_{(1-y6)})_{(1-x6)}P$. When the active layer is an MQW (Multi Quantum Well) active layer, the active layer may be the above-mentioned composite layer.

The upper first cladding layer can be formed of an $In_{x7}(Ga_{y7}Al_{(1-y7)})_{(1-x7)}P$ layer, and the ridge-shaped upper second cladding layer can be formed of $In_{x8}(Ga_{y8}Al_{(1-y8)})_{(1-x8)}P$ layer.

The current blocking layer can be formed of a single layer of GaAs, $Ga_{y9}Al_{(1-y9)}As$, $In_{x10}(Ga_{y10}Al_{(1-y10)})_{(1-x10)}P$ or $In_{x11}Al_{(1-x11)}P$, or a composite layer including a lower layer of $Ga_{y9}Al_{(1-y9)}As$, $In_{x10}(Ga_{y10}Al_{(1-y10)})_{(1-x10)}P$ or $In_{x11}Al_{(1-x11)}P$ disposed on the compound semiconductor substrate side and an upper layer of GaAs disposed on the contact layer side. The contact layer can be a GaAs layer.

The foregoing and other objects, features, aspects and advantages of the present invention will become more apparent from the following detailed description of embodiments of the present invention given with the accompanying drawings.

BRIEF DESCRIPTION OF THE DRAWINGS

FIGS. 4(a)–4(e) are schematic perspective views showing a method of producing the ridge type semiconductor laser devices of FIG. 1 and FIGS. 2(a) and 2(b) in the order of producing steps.

FIGS. 7(a) and 7(b) are schematic sectional views of the ridge type semiconductor laser device of FIG. 6 sectioned in the direction perpendicular to the length of the device.

DESCRIPTION OF THE PREFERRED EMBODIMENTS

Figure 1:
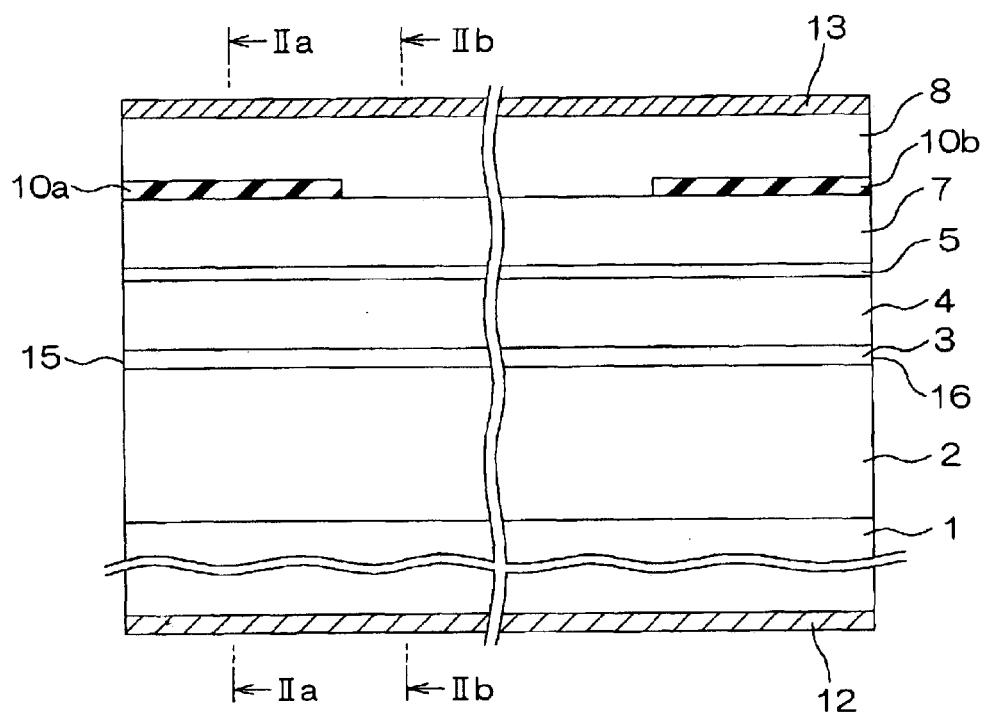
FIG. 1 is a schematic sectional view showing the structure of a semiconductor laser device according to a first embodiment of the present invention sectioned in the longitudinal direction of the device.
Figure 2A:
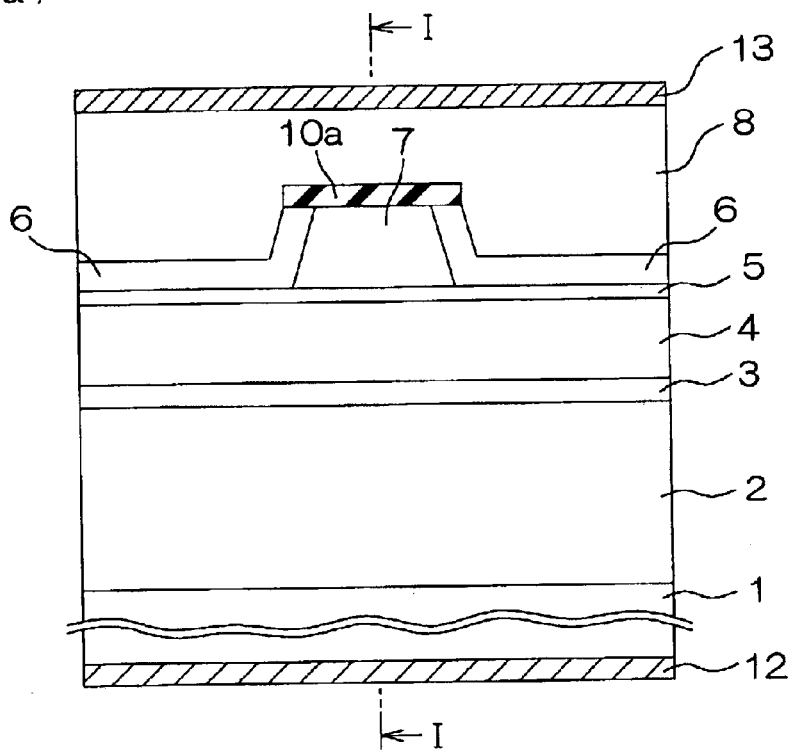
FIGS. 2(a) and 2(b) are schematic sectional views showing sections of the ridge type semiconductor laser device of FIG. 1 sectioned in the direction perpendicular to the length of the device.
Figure 2B:
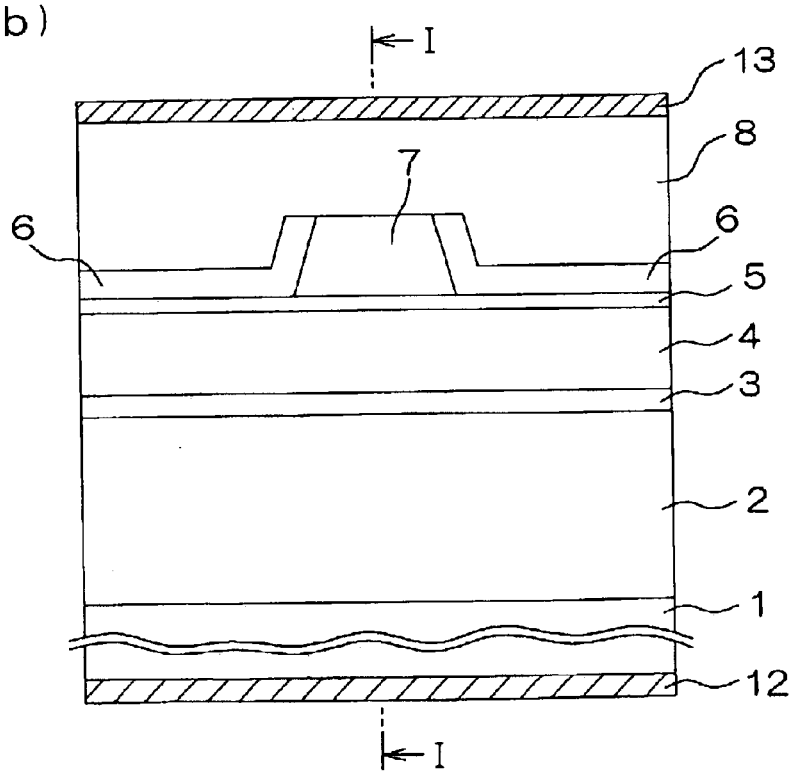

FIG. 1 is a schematic sectional view showing the structure of a ridge type semiconductor laser device according to a first embodiment of the present invention sectioned in the longitudinal direction of the device. FIGS. 2(a) and 2(b) are schematic sectional views showing sections of the ridge type semiconductor laser device of FIG. 1 sectioned in the direction perpendicular to the length of the device.

FIG. 2(a) is a sectional view along the line IIa—IIa in FIG. 1 and FIG. 2(b) is a sectional view along the line IIb—IIb in FIG. 1. FIG. 1 is a sectional view along the line I—I in FIGS. 2(a) and 2(b).

One end face of this ridge type semiconductor laser device in the longitudinal direction constitutes a laser emission end face 15, and the other side thereof constitutes a reflective end face 16.

On a substrate 1, a lower cladding layer 2, an active layer 3, an upper first cladding layer 4 and an etching stop layer 5 are stacked in this order. On the etching stop layer 5, a ridge-shaped upper second cladding layer 7 is formed substantially in the center of the width of the device so as to extend throughout the length of the device. On both sides of the upper second cladding layer 7, a current blocking layer 6 is formed. The current blocking layer 6 is formed in such a manner that it covers the side surfaces of the upper second cladding layer 7 and the upper surface of the etching stop layer 5. On the upper second cladding layer 7 and the current blocking layer 6, a contact layer 8 is formed in ohmic contact with the upper second cladding layer 7.

Between the upper second cladding layer 7 and the contact layer 8, current interrupting layers 10a and 10b are formed in the vicinity of the laser emission end face 15 and in the vicinity of the reflective end face 16, respectively. The current interrupting layers 10a and 10b are not formed in the inner portion of the device more than a predetermined distance farther respectively from the laser emission end face 15 and the reflective end face 16. In other words, in the inner portion of the device more than the predetermined distance farther respectively from the laser emission end face 15 and the reflective end face 16, the contact layer 8 is in contact with the upper surface of the upper second cladding layer 7.

The substrate 1 is formed of, for example, an n-type GaAs compound semiconductor substrate. In this case, the lower cladding layer 2 can be formed of an n-type $Al_{x1}Ga_{(1-x1)}As$ layer. The active layer 3 has a conductivity of n-type, p-type or undoped, and can be formed of a single layer of $Al_{y1}Ga_{(1-y1)}As$ or a composite layer of two kinds of layers having different compositions. That is, the active layer 3 can be an MQW (Multi Quantum Well) active layer formed of alternately stacked $Al_{y11}Ga_{(1-y11)}As$ layers and $Al_{y12}Ga_{(1-y12)}As$ layers (y11≠y12), or an MQW active layer formed of alternately stacked $Al_{y1}Ga_{(1-y1)}As$ layers and GaAs layers.

The upper first cladding layer 4 can be formed of a p-type $Al_{x2}Ga_{(1-x2)}As$ layer. The etching stop layer 5 can be formed of a p-type $In_{(1-z)}Ga_zP$ layer, which is resistant to an etching medium. The current blocking layer 6 can be formed of an n-type $Al_{y2}Ga_{(1-y2)}As$ layer, and the ridge-shaped upper second cladding layer 7 can be formed of a p-type $Al_{x3}Ga_{(1-x3)}As$ layer. The contact layer 8 can be formed of a p-type GaAs layer. The current interrupting layers 10a, 10b are formed of silicon oxide (SiO$_2$).

On the lower surface of the substrate 1 and the upper surface of the contact layer 8, an n-side electrode 12 and a p-side electrode 13 are formed respectively. The n-side electrode 12 and the p-side electrode 13 are formed throughout the whole length of the device from the laser emission end face 15 to the reflective end face 16.

At the time of laser emission, current is applied to the device through the n-side electrode 12 and the p-side electrode 13. Therefore, in these electrode sections, current flows throughout the whole length of the device. However, current hardly flows in the vicinity of the laser emission end face 15 and in the vicinity of the reflective end face 16 because there are current interrupting layers 10a, 10b respectively. Consequently, non-radiative recombination can be restrained at the laser emission end face 15 and the reflective end face 16 even if there are centers of non-radiative recombination. That is, according to a ridge type semiconductor laser device having such a structure, heat emission of the semiconductor laser device can be restrained, whereby the destructive optical output level can be remarkably raised. As a result, a semiconductor laser device having high optical output can be obtained.

The lengths of the current interrupting layers 10a, 10b in the longitudinal direction of the device (hereinafter referred to as "laser emission side non-injection width" and "reflective side non-injection width" respectively) can be optionally set. If the laser emission side non-injection width and the reflective side non-injection width are made excessively large with respect to the length of the device, the effect of restraining non-radiative recombination cannot be increased. On the other hand, if the laser emission side non-injection width and the reflective side non-injection width are made large, the length of the substantial current injection region becomes small, so that the drive current increases. Therefore, the laser emission side non-injection width and the reflective side non-injection width can be set to be suitable lengths with taking these points into consideration.

It is possible to provide both or either one of the current interrupting layer 10a on the laser emission end face 15 side and the current interrupting layer 10b on the reflective end face 16 side. Further, when both of the current interrupting layers 10a, 10b are provided, the laser emission side non-injection width and the reflective side non-injection width may be equal or different. Since heat emission due to non-radiative recombination occurs remarkably in the vicinity of the laser emission end face 15, it is possible to make the laser emission side non-injection width longer than the reflective side non-injection width, or to provide only the current interrupting layer 10a in the vicinity of the laser emission end face 15.

The current interrupting layers 10a, 10b can be formed of silicon nitride or aluminum oxide. In these cases, current can be suitably interrupted and heat emission in the vicinity of the laser emission end face 15 and in the vicinity of the reflective end face 16 can be restrained.

Figure 3:
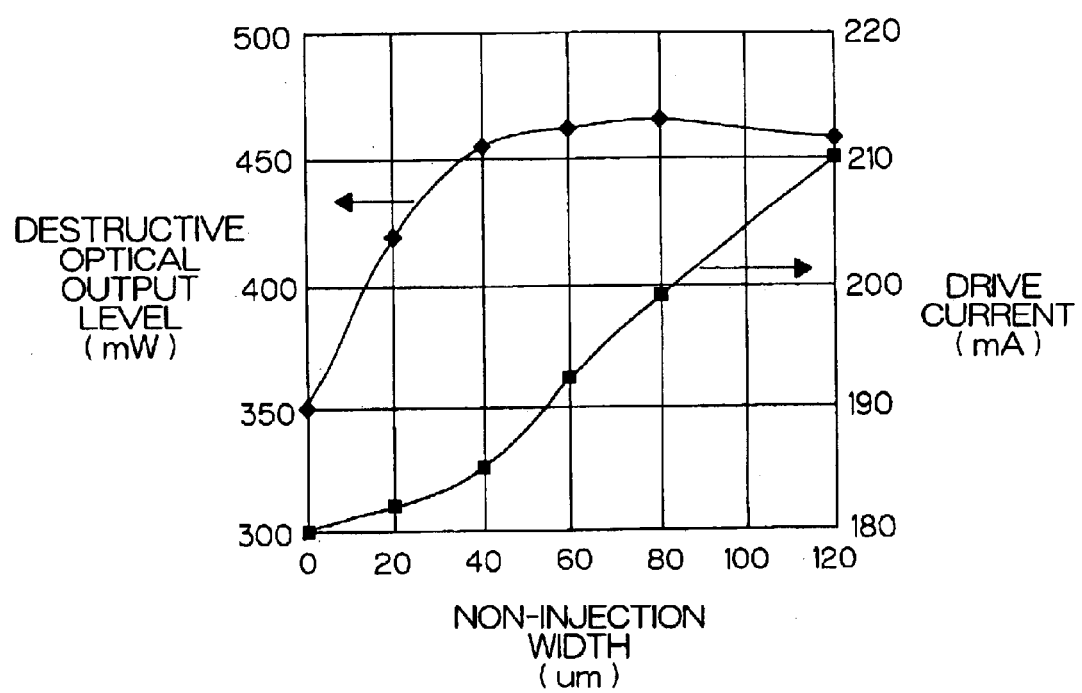
FIG. 3 is a characteristic diagram showing the relationship of the non-injection width, the destructive optical output level and the drive current.

With respect to a semiconductor laser device having the structure shown in FIG. 1, a variety of samples were produced which have different laser emission side non-injection widths and reflective side non-injection widths respectively. And the destructive optical output levels and the drive currents of the respective samples were measured. The results of the measurements are shown in a graph of FIG. 3. In each of the samples, the laser emission side non-injection width and reflective side non-injection width was set to be an equal length. In the graph of FIG. 3, the non-injection widths of the abscissa are the laser emission side non-injection widths (reflective side non-injection widths), and the drive currents of the ordinate are values at the temperature of 85° C. and at 100 mW.

The destructive optical output level is raised with the increase of the non-injection width when the non-injection width is not more than 40 μm. However, the destructive optical output level hardly change when the non-injection width becomes more than 40 μm, and rather decreases when the latter exceeds 80 μm. In more detail, the increase ratio of the drive current in the range where the non-injection width is below 40 μm is smaller than that in the range where the non-injection width is above 40 μm.

It can be said from above that, in order to obtain a destructive optical output level above 400 mW, the preferable non-injection width is 20~40 μm (for example, 30 μm).

FIGS. 4(a)~4(e) are schematic perspective views showing a method of producing the ridge type semiconductor laser devices of FIG. 1 and FIGS. 2(a) and 2(b) in the order of producing steps.

On the substrate 1, the lower cladding layer 2, the active layer 3, the upper first cladding layer 4, the etching stop layer 5 and the upper second cladding layer 7 are stacked in this order (FIG. 4(a)). These steps can be carried out by MOCVD (Metal-Organic Chemical Vapor Deposition) method.

Thereafter, a long, narrow strip of mask layer 11 is formed of SiO$_2$ on the surface of the upper second cladding layer 7. Such a mask layer 11 can be obtained by forming an SiO$_2$ layer on the whole surface of the upper second cladding layer by spattering method, and then patterning the same into a long, narrow strip shape by photo-etching method.

Thereafter, the upper second cladding layer 7 is etched in a ridge shape with the mask layer 11 acting as a mask. Thereby, the upper second cladding layer 7 below the mask layer 11 is partly removed. That is, the mask layer 11 is in a state of protruding widthwise from the ridge-shaped upper second cladding layer 7. Since the etching stop layer 5 has resistance to the etching medium, the etching stop layer 5 and the layers below the etching layer 5 are not etched. This state is shown in FIG. 4(b).

Next, the current blocking layer 6 is formed on both sides of the upper second cladding layer 7 by MOCVD method (FIG. 4(c)). At this time, the current blocking layer 6 selectively grows on the side faces of the ridge-shaped upper second cladding layer 7 and on the etching stop layer 5. That is, the material constituting the current blocking layer 6 is not deposited on the mask layer 11. Further, the spaces below the protruded portions of the mask layer 11 are filled with the current blocking layer Thereafter, the mask layer 11 is partly removed by etching with remaining two portions in the vicinity of both ends thereof respectively. These remaining portions of the mask layer 11 constitute the current interrupting layers 10a, 10b. This state is shown in FIG. 4(d). This step can be carried out by photo-etching method. That is, first, resists are formed on the surfaces of the portions of the mask layer 11 to remain. Then, the portion of the mask layer 11 having no resist thereon is removed by etching, and thereafter the resists are removed, so that the current interruption layers 10a, 10b can be obtained.

Further, on the current blocking layer 6, upper second cladding layer 7 and the current interrupting layers 10a, 10b, the contact layer 8 of p-type GaAs is formed by MOCVD method (FIG. 4(e)). Finally, on the lower surface of the substrate 1 and the upper surface of the contact layer 8, an n-side electrode and a p-side electrode (not shown) are formed respectively, whereby the ridge-type semiconductor device is completed. In the above-mentioned description, one ridge-type semiconductor laser device (chip) is a unit of production. However, the layers can be formed on a large-sized substrate 1 on which regions corresponding to a plurality of chips are arranged, and then each of chips can be obtained by cleaving.

According to such a method of producing a semiconductor laser device, the current interrupting layers 10a, 10b can be formed by utilizing the mask layer 11 that is used in the conventional method of producing a semiconductor laser device. In other words, according to the conventional producing method, the mask layer 11 is completely removed after the current blocking layer 6 is formed. However, according to the producing method of the present invention, the mask layer 11 is partly removed and the remaining portions constitute the current interrupting layers 10a, 10b. Consequently, according to such a producing method, a high optical output semiconductor laser device having current interrupting layers 10a, 10b can be obtained without largely increasing producing steps in comparison with those of the conventional method.

According to the above-mentioned method, the step of partly removing the mask layer 11 (FIG. 4(d)) is carried out after the spaces below the protruded portions of the mask layer 11 are filled with the current blocking layer 6. In this state, the mask layer 11 is etched, so that the mask layer 11 is etched only from the upper surface thereof, whereby only the portion having no resist thereon can be suitably removed.

The mask layer 11 may be formed of silicon nitride or aluminum oxide. In this case, a semiconductor laser device having current interrupting layers 10a, 10b formed of silicon nitride or aluminum oxide can be obtained.

The above-mentioned semiconductor laser device is an example of AlGaAs based one. However, it may be an InGaAlP based one. That is, the substrate 1 can be formed of a GaAs compound semiconductor substrate, and the lower cladding layer 2 can be formed of an $In_{x1}(Ga_{y1}Al_{(1-y1)})_{(1-x1)}P$ layer. The active layer 3 can be formed of a single layer of $In_{x2}Ga_{(1-x2)}P$, a composite layer of $In_{x3}Ga_{(1-x3)}P$ layer and $In_{x4}(Ga_{y4}Al_{(1-y4)})_{(1-x4)}P$ layer or a composite layer of $In_{x5}(Ga_{y5}Al_{(1-y5)})_{(1-x5)}P$ layer and $In_{x6}(Ga_{y6}Al_{(1-y6)})_{(1-x6)}P$ layer.

The upper first cladding layer 4 can be formed of an $In_{x7}(Ga_{y7}Al_{(1-y7)})_{(1-x7)}P$ layer, and the upper second cladding layer 7 can be formed of $In_{x8}(Ga_{y8}Al_{(1-y8)})_{(1-x8)}P$ layer. The current blocking layer 6 can be formed of a layer of GaAs, $Ga_{y9}Al_{(1-y9)}As$, $In_{x10}(Ga_{y10}Al_{(1-y10)})_{(1-x10)}P$ or $In_{x11}(Ga_{y11}Al_{(1-y11)})_{(1-x11)}P$. The contact layer 8 may be formed of a GaAs layer.

Figure 5A:
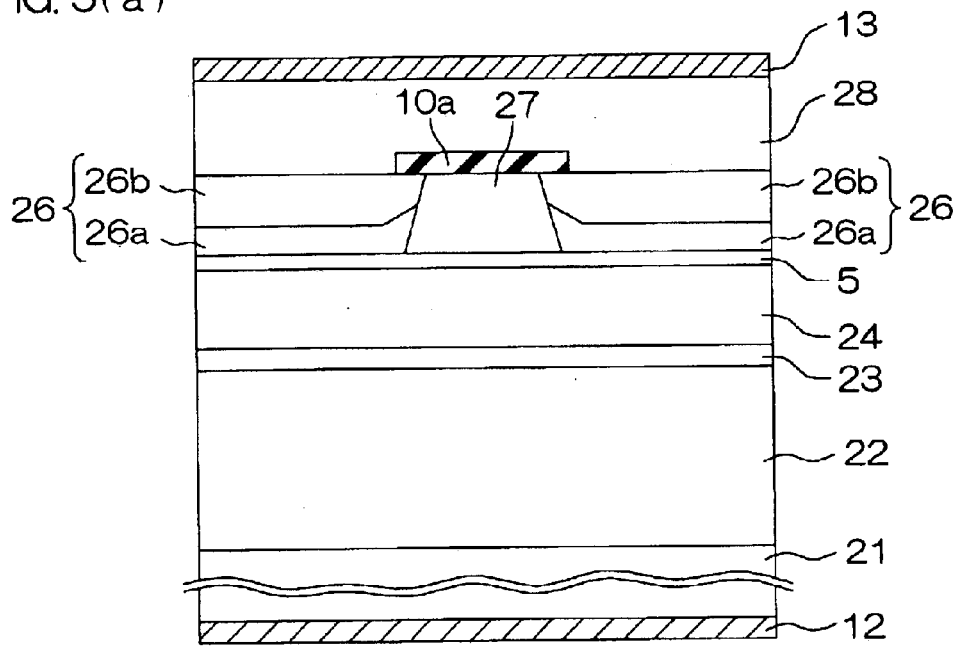
FIGS. 5(a) and 5(b) are schematic sectional views showing the structure of the ridge type semiconductor laser device according to a second embodiment of the present invention sectioned in the direction perpendicular to the length of the device.
Figure 5B:
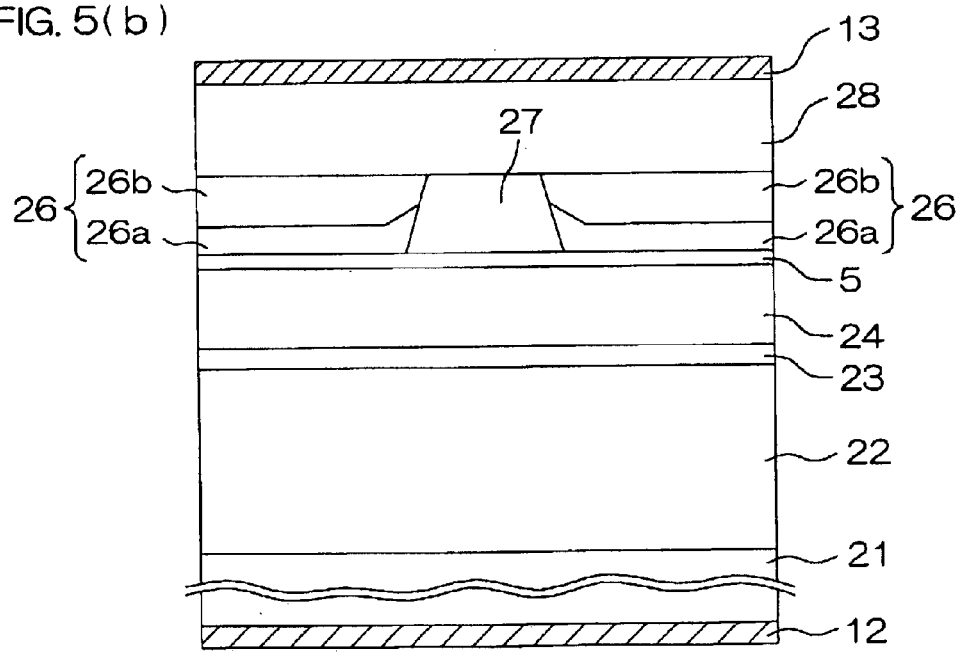

FIGS. 5(a) and 5(b) are schematic sectional views showing the structure of a ridge type semiconductor laser device according to a second embodiment of the present invention sectioned in the direction perpendicular to the length of the device. FIG. 5(a) shows a section in the vicinity of the laser emission end face 15, while FIG. 5(b) shows a section in the vicinity of the middle portion of the length of the device. In FIGS. 5(a) and 5(b), the same parts of the semiconductor laser device as those of the first embodiment shown in FIG. 1 and FIGS. 2(a) and 2(b) are designated with the same numerals and characters, with description thereof being omitted.

On a substrate 21, a lower cladding layer 22, an active layer 23, an upper first cladding layer 24 and an etching stop layer 5 are stacked in this order. On the upper first cladding layer 24, a ridge-shaped upper second cladding layer 27 is formed substantially in the center of the width of the device so as to extend throughout the length of the device. On both sides of the upper second cladding layer 27, a current blocking layer 26 is formed. The current blocking layer 26 is formed in such a manner that it covers the side surfaces of the upper second cladding layer 27 and the upper surface of the etching stop layer 5, and it includes a lower layer 26a on the substrate 21 side and an upper layer 26b on the lower layer 26a (on the side farther from the substrate 21). On the upper second cladding layer 27 and the current blocking layer 26, a contact layer 28 is formed in ohmic contact with the upper second cladding layer 27.

Between the upper second cladding layer 27 and the contact layer 28, current interrupting layers 10a and 10b are formed in the vicinity of the laser emission end face 15 (FIG. 4(a)). The current interrupting layers 10a and 10b are not formed in the inner portion of the device more than the predetermined distance farther respectively from the laser emission end face 15 and the reflective end face 16. In other words, in the inner portion of the device more than a predetermined distance farther respectively from the laser emission end face 15 and the reflective end face 16, the contact layer 28 is in contact with the upper surface of the upper second cladding layer 27.

The substrate 21 is formed of, for example, an n-type GaAs compound semiconductor substrate. In this case, the lower cladding layer 22 can be formed of an n-type $In_{x1}(Ga_{y1}Al_{(1-y1)})_{(1-x1)}P$ layer. The active layer 23 has a conductivity of n-type, p-type or undoped, and can be formed of a single layer of $In_{x2}Ga_{(1-x2)}P$, or a composite layer comprising two layers having different compositions. That is, the active layer 23 may be an MQW (Multi Quantum Well) active layer formed of alternately stacked $In_{x5}(Ga_{y5}Al_{(1-y5)})_{(1-x5)}P$ layer and $In_{x6}(Ga_{y6}Al_{(1-y6)})_{(1-x6)}P$ layer (y5≠y6) or an MQW active layer formed of alternately stacked $In_{x3}Ga_{(1-x3)}P$ layer and $In_{x4}(Ga_{y4}Al_{(1-y4)})_{(1-x4)}P$ layer.

The upper first cladding layer 24 can be formed of a p-type $In_{x7}(Ga_{y7}Al_{(1-y7)})_{(1-x7)}P$ layer. The current blocking layer 26 may have a conductivity of n-type, and the lower layer 26a can be formed of a $Ga_{y9}Al_{(1-y9)}As$ layer, an $In_{x10}(Ga_{y10}Al_{(1-y10)})_{(1-x10)}P$ layer or an $In_{x11}Al_{(1-x11)}P$ layer. And the upper layer 26b can be formed of a GaAs layer. The ridge-shaped upper second cladding layer 27 can be formed of a p-type $In_{x8}(Ga_{y8}Al_{(1-y8)})_{(1-x8)}P$ layer, and the contact layer 28 can be formed of a p-type GaAs layer.

In such a semiconductor laser device formed of InGaAsP based material, the current interrupting layers 10a, 10b have the same effect as the effect that the current interrupting layers 10a, 10b have in a semiconductor laser device formed of AlGaAs based material (the first embodiment).

A semiconductor laser device of the second embodiment can be obtained by a similar producing method to that of the first embodiment. In this case, when the current blocking layer 26 of ternary or quaternary mixed crystal such as AlGaAs based material is intended to be formed by MOCVD method on both sides of the upper second cladding layer 27 re-formed into a ridge shape using the strip-shaped mask layer 11, the material constituting the current blocking layer 26 is stacked also on the mask layer 11. Therefore, forming, first, a thin layer of the ternary mixed crystal material as the lower layer 26a, and then forming the upper layer 26b of GaAs can prevent this. That is, with such a structure, the current blocking layer 26 can suitably selectively grow on both sides of the upper second cladding layer 27, and at the same time, the current blocking layer 26 having a necessary thickness can be obtained.

Further, in a semiconductor laser device mainly formed of AlGaAs material like the device of the first embodiment of the present invention, the above-mentioned effect can be obtained by constituting the current blocking layer 6 by a lower layer of ternary mixed crystal and an upper layer of GaAs.

Figure 6:
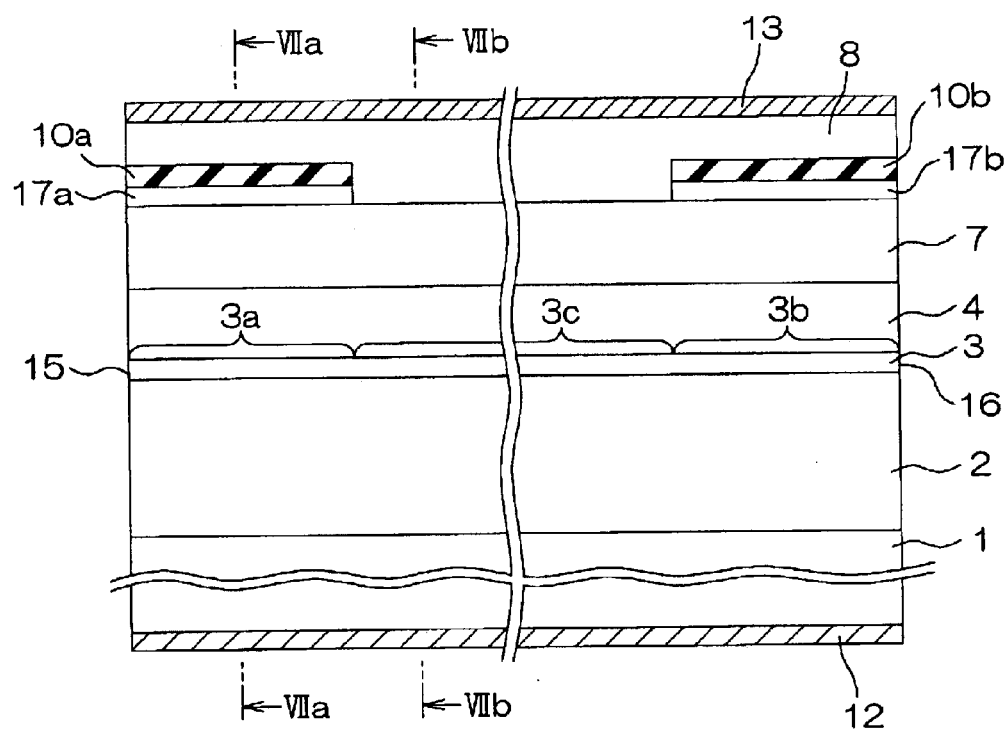
FIG. 6 is a schematic sectional view showing the structure of a ridge type semiconductor laser device according to a third embodiment of the present invention sectioned in the longitudinal direction of the device.

FIG. 6 is a schematic sectional view showing the structure of a ridge type semiconductor laser device according to a third embodiment of the present invention sectioned in the longitudinal direction of the device. FIGS. 7(a) and 7(b) are schematic sectional views of the ridge type semiconductor laser device of FIG. 6 sectioned in the direction perpendicular to the length of the device. FIG. 7(a) is a sectional view along the line VIIa—VIIa in FIG. 1 and FIG. 7(b) is a sectional view along the line VIIb—VIIb in FIG. 6. FIG. 6 is a sectional view along the line VI—VI in FIGS. 7(a) and 7(b). In FIG. 6 and FIGS. 7(a), 7(b), parts corresponding to the members shown in FIG. 1 and FIGS. 2(a) and 2(b) are designated with the same numerals and characters.

Unlike the above-mentioned device of the first embodiment, this ridge type semiconductor laser device has no etching stop layer, but this is not an essential difference.

A characteristic difference of the device of this embodiment from that of the first embodiment is that zinc diffusion source layers 17a, 17b are formed between the upper second cladding layer 7 and the contact layer 8 and in the vicinity of the laser emission end face 15 and the reflective end face 16 respectively. Between the zinc diffusion source layers 17a, 17b and the contact layer 8, current interrupting layers 10a, 10b are superposed on the zinc diffusion source layers 17a, 17b when seen in plan view.

The zinc diffusion source layers 17a, 17b and the current interrupting layers 10a and 10b are not formed in the inner portion of the device more than a predetermined distance farther respectively from the laser emission end face 15 and the reflective end face 16. In other words, in the inner portion of the device more than the predetermined distance farther respectively from the laser emission end face 15 and the reflective end face 16, the contact layer 8 is in contact with the upper surface of the upper second cladding layer 7.

The zinc diffusion source layers 17a, 17b are formed of ZnO. The current interrupting layers 10a, 10b are formed of, for example, $SiO_2$, similarly to the case of the first embodiment.

Each layer of such a semiconductor laser device as above-mentioned can be formed by MOCVD method, spattering method or the like. At the time of such layer formation, a specimen (substrate 1 on which layers including zinc diffusion source layers 17a, 17b are formed) is subjected to, for example, a temperature of 500~600° C. after the zinc diffusion source layers 17a, 17b are formed. In this case, zinc (Zn) is diffused from the zinc diffusion source layers 17a, 17b and introduced into the active layer 3 below the zinc diffusion source layers 17a, 17b, so that unregulated portions 3a, 3b are formed in which the arrangement of the constituent atoms is out of order. If the active layer is an MQW active layer, in the unregulated portions 3a, 3b, the compositions of alternately stacked layers i.e. $Al_{y11}Ga_{(1-y11)}$As and $Al_{y12}Ga_{(1-y12)}$As (y11≠y12), or $Al_{y1}Ga_{(1-y1)}$As and GaAs are homogenized.

In the active layer 3, the portion not below the zinc diffusion source layers 17a, 17b is a regulated arrangement portion 3c in which Zn is not introduced and the arrangement of the constituent atoms is regulated. The band gap in the unregulated portions 3a, 3b is larger than in the regulated portion 3c.

Therefore, the active layer 3 has larger band gap in the vicinity of the laser emission end face 15 and in the vicinity of the reflective end face 16 than in the inner portion. In such portions having larger band gap, laser light absorption does not occur. Consequently, even if the temperature rises to some extent due to non-radiative recombination occurring in the laser emission end face 15 and the reflective end face 16, the band gap in these portions does not easily reach such a level as causing laser light absorption, since the initial band gap in these portions is large. And if laser light is not absorbed in the laser emission end face 15 and the reflective end face 16, then COD does not occur. As a result, the destructive optical output level of a semiconductor laser device can be remarkably improved, and thereby a high output semiconductor laser device can be realized.

Since the zinc diffusion source layers 17a, 17b are disposed near the active layer 3, Zn can be efficiently introduced into the active layer 3 by diffusion.

It is possible to provide both or either one of the zinc diffusion source layer 17a on the laser emission end face 15 side and the zinc diffusion source layer 17b on the reflective end face 16 side. The size (thickness, width and length in the longitudinal direction of the device) of each zinc diffusion source layer can be optionally selected as long as a predetermined portion or portions of the active layer 3 are unregulated by zinc diffusion.

The zinc diffusion source layers 17a, 17b may be formed by doping Zn to an insulating material. In this case, by heating a specimen, Zn can be easily diffused into the active layer 3. By suitably selecting the doping amount of Zn to the insulating material, the Zn amount diffused into the active layer 3 can be easily controlled. For example, when the whole of the zinc diffusion source layer is formed of ZnO as described in the above-mentioned embodiment, the Zn amount diffused into the active layer 3 at the time of heating or the like sometimes becomes too large. For solving this problem, zinc diffusion source layers 17a, 17b formed by doping Zn to an insulating material are used, so that the Zn amount in the zinc diffusion source layers 17a, 17b can be reduced, and the Zn amount diffused at the time of heating can be controlled. The insulating material may be silicon oxide, silicon nitride or the like.

Similarly to the case of the first embodiment, it is possible to provide both or either one of the current interrupting layer 10a on the laser emission end face 15 side and the current interrupting layer 10b on the reflective end face 16 side. Further, when both of the current interrupting layers 10a, 10b are provided, the lengths thereof in the longitudinal direction of the device may be equal or different. Since heat emission due to non-radiative recombination occurs remarkably in the vicinity of the laser emission end face 15, it is possible to make the length of the current interrupting layer 10a in the longitudinal direction of the device longer than that of the current interrupting layer 10b, or to provide only the current interrupting layer 10a in the vicinity of the laser emission end face 15.

In this embodiment, the current interrupting layers 10a, 10b are superposed on the zinc diffusion source layers 17a, 17b when seen in plan view. However, the present invention is not limited to such a structure, and the sizes and positions of the zinc diffusion source layers 17a, 17b can be set separately from the sizes and positions of the current interrupting layers 10a, 10b.

Between the upper first cladding layer 4 and the upper second cladding layer 7, an etching stop layer (layer having resistance to the etching medium) may be provided, which is used at the time of re-forming the upper second cladding layer 7 into a ridge shape. The upper second cladding layer 7 can be re-formed into a ridge shape by etching with using a strip-shaped SiO$_2$ mask layer as a mask. In that case, it is possible to make the current blocking layer 6 selectively grow on the side faces of the ridge-shaped upper second cladding layer 7 by MOCVD method. Thereafter, the portion of the mask layer other than the portions in the vicinity of the laser emission end face 15 and in the vicinity of the reflective end face 16 are removed, so that the remaining portions of the mask layer can constitute the current interrupting layers 10a, 10b.

In order to obtain a semiconductor laser device having no current interrupting layers 10a, 10b, the mask layer has only to be completely removed after making the current blocking layer 6 selectively grow.

Figure 8A:
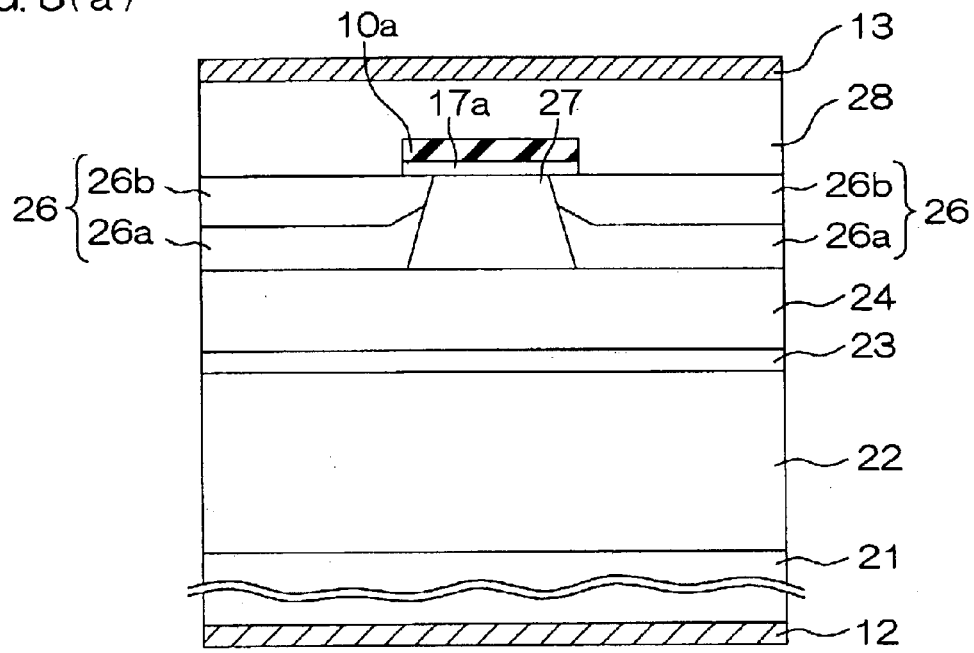
FIGS. 8(a) and 8(b) are schematic sectional views showing the structure of a semiconductor laser device according to a fourth embodiment of the present invention sectioned in the direction perpendicular to the length of the device.
Figure 8B:
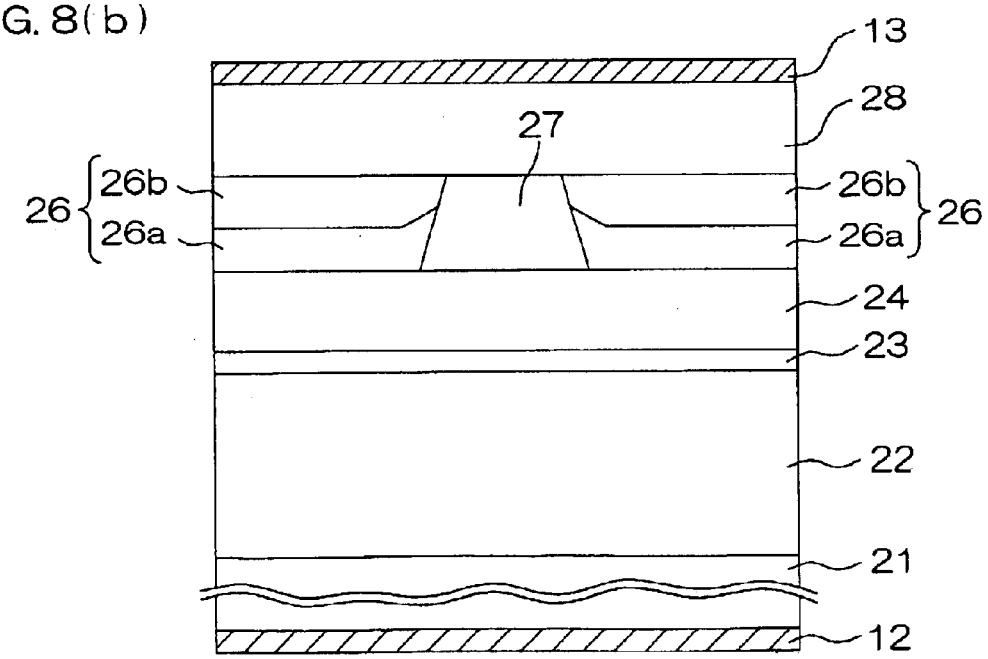

FIGS. 8(a) and 8(b) are schematic sectional views showing the structure of a ridge type semiconductor laser device according to a fourth embodiment of the present invention sectioned in the direction perpendicular to the length of the device. FIG. 8(a) shows a section in the vicinity of the laser emission end face 15, and FIG. 8(b) shows a section in the vicinity of the middle portion of the length of the device. In FIGS. 8(a) and 8(b), portions corresponding to the portions shown in FIGS. 5(a) and 5(b), FIG. 6 and FIGS. 7(a) and (b) are designated with the same numbers and characters.

Unlike the case of the second embodiment shown in FIGS. 5(a) and 5(b), a device of this embodiment has no etching stop layer 5, but it is not an essential difference.

In this embodiment, between the upper second cladding layer 27 and the contact layer 28, zinc diffusion source layers 17a, 17b are provided in the vicinity of the laser emission end face 15 (FIG. 8(a)) and in the vicinity of the reflective end face 16, respectively. Between the zinc diffusion source layers 17a, 17b and the contact layer 28, the current interrupting layers 10a, 10b are superposed on the zinc diffusion source layers 17a, 17b respectively when seen in plan view.

The zinc diffusion source layers 17a, 17b and the current interrupting layers 10a and 10b are not formed in the inner portion of the device more than a predetermined distance farther respectively from the laser emission end face 15 and the reflective end face 16. In other words, in the inner portion of the device more than the predetermined distance farther respectively from the laser emission end face 15 and the reflective end face 16, the contact layer 28 is in contact with the upper surface of the upper second cladding layer 27.

In such a semiconductor laser device formed of InGaAsP based material, the zinc diffusion source layers 17a, 17b and the current interrupting layers 10a, 10b have the same effect as the effect that the zinc diffusion source layers 17a, 17b and the current interrupting layers 10a, 10b have in a semiconductor laser device formed of AlGaAs based material (the third embodiment)

In the above-mentioned second and fourth embodiments, the current blocking layer 26 is a composite layer including the lower layer 26a and the upper layer 26b. However, the current blocking layer 26 may be a single layer formed of a GaAs layer, a Ga$_{y9}$Al$_{(1-y9)}$As layer, an In$_{x10}$(Ga$_{y10}$Al$_{(1-y10)}$)$_{(1-x10)}$P layer or an In$_{x11}$Al$_{(1-x11)}$P layer.

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Applications No.2001-377444 and No.2001-377445 filed in the Japan Patent Office on Dec. 11, 2001, and the whole disclosures of these Japanese applications are incorporated in this application by reference.

What is claimed is:

1. A semiconductor laser device, comprising:

an Al$_{x1}$Ga$_{(1-x1)}$As lower cladding layer, an active layer selected from the group of layers consisting of a single layer of Al$_{y1}$Ga$_{(1-y1)}$As, a composite layer of Al$_{y11}$Ga$_{(1-y11)}$As and Al$_{y12}$Ga$_{(1-y12)}$As, and a composite layer of Al$_{y1}$Ga$_{(1-y1)}$As and GaAs and an Al$_{x2}$Ga$_{(1-x2)}$As upper first cladding layer stacked on a GaAs compound semiconductor substrate;

an Al$_{x3}$Ga$_{(1-x3)}$As ridge-shaped upper second cladding layer provided on the upper first cladding layer;

a current blocking layer provided on both sides of the upper second cladding layer, wherein the current blocking layer is a single layer of Al$_{y2}$Ga$_{(1-y2)}$As or a composite layer including a lower layer of Al$_{y3}$Ga$_{(1-y3)}$As or a composite layer including a lower layer of Al$_{y3}$Ga$_{(1-y3)}$As disposed on the compound semiconductor substrate side and an upper layer of GaAs disposed on the contact layer side;

a GaAs contact layer provided on the upper second cladding layer; and a current interrupting layer or layers formed of an insulating material and provided between the upper second cladding layer and the contact layer, in a vicinity of at least one of a laser emission end face and a reflective end face, which are both end faces of the device in a longitudinal direction of the upper second cladding layer.

2. A semiconductor laser device according to claim 1, in which the current interrupting layer is formed of silicon oxide, silicon nitride or aluminum oxide.

3. A semiconductor laser device comprising:

a lower cladding layer, an active layer and an upper first cladding layer stacked on a compound semiconductor substrate;

a ridge-shaped upper second cladding layer provided on the upper first cladding layer;

a current blocking layer provided on both sides of the upper second cladding layer;

a contact layer provided on the upper second cladding layer; and a current interrupting layer or layers formed of an insulating material and provided between the upper second cladding layer and the contact layer, in a vicinity are both end faces of the device in a longitudinal direction of the upper second cladding layer, wherein the compound semiconductor substrate is a GaAs compound semiconductor substrate;

the lower cladding layer is an In$_{x1}$(Ga$_{y1}$Al$_{(1-y1)}$)$_{(1-x1)}$P layer;

the active layer is a single layer of In$_{x2}$Ga$_{(1-x2)}$P layer, a composite layer of In$_{x3}$Ga$_{(1-x3)}$P and In$_{x4}$(Ga$_{y4}$Al$_{(1-y4)}$)$_{(1-x4)}$P or a composite layer of In$_{x5}$(Ga$_{y5}$Al$_{(1-y5)}$)$_{(1-x5)}$P and In$_{x6}$(Ga$_{y6}$Al$_{(1-y6)}$)$_{(1-x6)}$P;

the upper first cladding layer is an In$_{x7}$(Ga$_{y7}$Al$_{(1-y7)}$)$_{(1-x7)}$P layer;

the ridge shaped upper second cladding layer is an In$_{x8}$(Ga$_{y8}$Al$_{(1-y8)}$)$_{(1-x8)}$P layer;

the current blocking layer is a single layer of GaAs, $Ga_{y9}Al_{(1-y9)}As$, $In_{x10}(Ga_{y10}Al_{(1-y10)})_{(1-x10)}P$ or $In_{x1}Al_{(1-x11)}P$, or a composite layer including a lower layer of $Ga_{y9}Al_{(1-y9)}As$, $In_{x10}(Ga_{y10}Al_{(1-y10)})_{(1-x10)}P$ or $In_{x11}Al_{(1-x11)}P$ disposed on the compound semiconductor substrate side, and an upper layer of GaAs disposed on the contact layer side; and the contact layer is a GaAs layer.

4. A semiconductor laser device according to claim 3, in which the current interrupting layer is formed of silicon oxide, silicon nitride or aluminum oxide.

5. A semiconductor laser device, comprising:

a lower cladding layer, an active layer and an upper first cladding layer stacked on a compound semiconductor substrate in this order;

a ridge-shaped upper second cladding layer provided on the upper first cladding layer;

a current blocking layer provided on both sides of the upper second cladding layer;

a contact layer provided on the upper second cladding layer; and a zinc diffusion source layer or layers including zinc and provided between the upper second cladding layer and the contact layer, in a vicinity of at least one of a laser emission end face and a reflective end face, which are both end faces of the device in a longitudinal direction of the upper second cladding layer, wherein the compound semiconductor substrate is a GaAs compound semiconductor substrate, the lower cladding layer is an $Al_{x1}Ga_{(1-x1)}As$ layer, the active layer is a single layer of $Al_{y1}Ga_{(1-y1)}As$ or a composite layer of $Al_{y11Ga(1-y11)}As$ and $Al_{y12}Ga_{(1-y12)}As$, or a composite layer of $Al_{y1}Ga_{(1-y1)}As$ and GaAs, the upper first cladding layer is an $Al_{x2}Ga_{(1-x2)}As$ layer, the ridge-shaped upper second cladding layer is an $Al_{x3}Ga_{(1-x3)}As$ layer, the current blocking layer is a single layer of $Al_{y2}Ga_{(1-y2)}As$, or a composite layer including a lower layer of $Al_{y3}Ga_{(1-y3)}As$ disposed on the compound semiconductor substrate side and an upper layer of GaAs disposed on the contact layer side, and the contact layer is a GaAs layer.

6. A semiconductor laser device according to claim 5, further comprising a current interrupting layer or current interrupting layers formed of an insulating material and provided between the zinc diffusion source layer and the contact layer, in a vicinity of at least one of a laser emission end face and a reflective end face, which are both end faces of the device in the longitudinal direction of the upper second cladding layer.

7. A semiconductor laser device according to claim 5, in which the zinc diffusion source layer or layers are formed of zinc oxide.

8. A semiconductor laser device according to claim 5, in which the zinc diffusion source layer or layers are formed by doping zinc to a insulating material.

9. A semiconductor laser device comprising:

a lower cladding layer, an active layer and an upper first cladding layer stacked on a compound semiconductor substrate in this order;

a ridge-shaped upper second cladding layer provided on the upper first cladding layer;

a current blocking layer provided on both sides of the upper second cladding layer;

a contact layer provided on the upper second cladding layer; and a zinc diffusion source layer or layers including zinc and provided between the upper second cladding layer and the contact layer, in a vicinity of at least one of a laser emission end face and a reflective end face, which are both end faces of the device in a longitudinal direction of the upper second cladding layer, wherein the compound semiconductor substrate is a GaAs compound semiconductor substrate;

the lower cladding layer is an $In_{x1}(Ga_{y1}Al_{(1-y1)})_{(1-x1)}P$ layer;

the active layer is a single layer of $In_{x2}Ga_{(1-x2)}P$, a composite layer of $In_{x3}Ga_{(1-x3)}P$ and $In_{x4}(Ga_{y4}Al_{(1-y4)})_{(1-x4)}P$, or a composite layer of $In_{x5}(Ga_{y5}Al_{(1-y5)})_{(1-x5)}P$ and $In_{x6}(Ga_{y6}Al_{(1-y6)})_{(1-x6)}P$;

the upper first cladding layer is an $In_{x7}(Ga_{y7}Al_{(1-y7)})_{(1-x7)}P$ layer;

the ridge-shaped upper second cladding layer is an $In_{x8}(Ga_{y8}Al_{(1-y8)})_{(1-x8)}P$ layer;

the current blocking layer is a single layer of GaAs, $Ga_{y9}Al_{(1-y9)}As$, $In_{x10}(Ga_{y10}Al_{(1-y10)})_{(1-x10)}P$ or $In_{x11}Al_{(1-x11)}P$, or a composite layer including a lower layer of $Ga_{y9}Al_{(1-y9)}As$, $In_{x10}(Ga_{y10}Al_{(1-y10)})_{(1-x10)}P$ or $In_{x11}Al_{(1-x11)}P$ disposed on the compound semiconductor substrate side and an upper layer of GaAs disposed on the contact layer side; and the contact layer is a GaAs layer.

10. A semiconductor laser device according to claim 9, in which the zinc diffusion source layer or layers are formed of zinc oxide.

11. A semiconductor laser device according to claim 9, in which the zinc diffusion source layer or layers are formed by doping zinc to an insulating material.

12. A semiconductor laser device according to claim 9, further comprising a current interrupting layer or current interrupting layers formed of an insulating material and provided between the zinc diffusion source layer and the contact layer, in a vicinity of at least one of a laser emission end face and a reflective end face, which are both end faces of the device in the longitudinal direction of the upper second cladding layer.

13. A method of producing a semiconductor laser device, comprising:

a step of stacking an $Al_{x1}Ga_{(1-x1)}As$ lower cladding layer, an active layer, an $Al_{x2}Ga_{(1-x2)}As$ upper first cladding layer and an $Al_{x3}Ga_{(1-x3)}As$ upper second cladding layer on a GaAs compound semiconductor substrate in this order, wherein the active layer is selected from the group of layers consisting of a single layer of $Al_{y1}Ga_{(1-y1)}As$, a composite layer of $Al_{y11}Ga_{(1-y11)}As$ and $Al_{y12}Ga_{(1-y12)}As$, and a composite layer of $Al_{y1}Ga_{(1-y1)}As$ and GaAs;

a step of forming a strip-shaped mask layer of an insulating material on the upper second cladding layer;

a step of re-forming the upper second cladding layer into a ridge shape using the mask layer;

a step of making a current blocking layer selectively grow on both sides of the ridge-shaped upper second cladding layer, wherein the current blocking layer is a single layer of $Al_{y2}Ga_{(1-y2)}As$ or a composite layer including a lower layer of $Al_{y3}Ga_{(1-y3)}As$ disposed on the compound semiconductor substrate side and an upper layer of GaAs disposed on the contact layer side;

a step of removing the mask layer with at least a portion in a vicinity of one end thereof in a longitudinal direction of the mask layer being left; and a step of forming, on the upper second cladding layer, a GaAs contact layer which is in ohmic contact with the upper second cladding layer.

14. A method of producing a semiconductor laser device according to claim 13, in which the mask layer is formed of silicon oxide, silicon nitride or aluminum oxide.

15. A method of producing a semiconductor laser device, comprising:

a step of stacking an $In_{x1}(Ga_{y1}Al_{(1-y1)})_{(1-x1)}P$ lower cladding layer, an active layer, an $Al_{x2}Ga_{(1-x2)}As$ upper first cladding layer and an $Al_{x3}Ga_{(1-x3)}As$ upper second cladding layer on a GaAs compound semiconductor substrate in this order, wherein the active layer is selected from the group of layers consisting of a single layer of $In_{x2}Ga_{(1-x2)}P$, a composite layer of $In_{x3}Ga_{(1-x3)}P$ and $In_{x4}(Ga_{y4}Al_{(1-y4)})_{(1-x4)}P$ or a composite layer of $In_{x5}(Ga_{y5}Al_{(1-y5)})_{(1-x5)}P$ and $In_{x6}(Ga_{y6}Al_{(1-y6)})_{(1-x6)}P$;

a step of forming a strip-shaped mask layer of an insulating material on the upper second cladding layer;

a step of re-forming the upper second cladding layer into a ridge shape using the mask layer;

a step of making a current blocking layer selectively grow on both sides of the ridge-shaped upper second cladding layer, wherein the current blocking layer is a single layer of GaAs, $Ga_{y9}Al_{(1-y9)}As$, $In_{x10}(Ga_{y10}Al_{(1-y10)})_{(1-x10)}P$ or $In_{x11}Al_{(1-x11)}P$, or a composite layer including a lower layer of $Ga_{y9}Al_{(1-y9)}As$, $In_{x10}(Ga_{y10}Al_{(1-y10)})_{(1-x10)}P$ or $In_{x11}Al_{(1-x11)}P$ disposed on the compound semiconductor substrate side, and an upper layer of GaAs disposed on the contact layer side;

a step of removing the mask layer with at least a portion in a vicinity of one end thereof in a longitudinal direction of the mask layer being left; and a step of forming, on the upper second cladding layer, a GaAs contact layer which is in ohmic contact with the upper second cladding layer.

16. A method of producing a semiconductor laser device according to claim 15, in which the mask layer is formed of silicon oxide, silicon nitride or aluminum oxide.

17. A method of producing a semiconductor laser device, comprising:

a step of stacking an $Al_{x1}Ga_{(1-x1)}As$ lower cladding layer, an active layer, an $Al_{x2}Ga_{(1-x2)}As$ upper first cladding layer and an $Al_{x3}Ga_{(1-x3)}As$ upper second cladding layer on a GaAs compound semiconductor substrate in this order, wherein the active layer is selected from the group of layers consisting of a single layer of $Al_{y1}Ga_{(1-y1)}As$, a composite layer of $Al_{y11}Ga_{(1-y11)}As$ and $Al_{y12}Ga_{(1-y12)}As$, and a composite layer of $Al_{y1}Ga_{(1-y1)}As$ and GaAs;

a step of forming a strip-shaped mask layer of an insulating material on the upper second cladding layer;

providing zinc in the mask layer;

a step of re-forming the upper second cladding layer into a ridge shape using the mask layer;

a step of making a current blocking layer selectively grow on both sides of the ridge-shaped upper second cladding layer, wherein the current blocking layer is a single layer of $Al_{y2}Ga_{(1-y2)}As$ or a composite layer including a lower layer of $Al_{y3}Ga_{(1-y3)}As$ disposed on the compound semiconductor substrate side and an upper layer of GaAs disposed on the contact layer side;

a step of removing the mask layer with at least a portion in a vicinity of one end thereof in a longitudinal direction of the mask layer being left, the portion left containing zinc so include a zinc diffusion source layer; and a step of forming, on the upper second cladding layer, a GaAs contact layer which is in ohmic contact with the upper second cladding layer.

18. A method of producing a semiconductor laser device, comprising:

a step of stacking an $In_{x1}(Ga_{y1}Al_{(1-y1)})_{(1-x1)}P$ lower cladding layer, an active layer, an $Al_{x2}Ga_{(1-x2)}As$ upper first cladding layer and an $Al_{x3}Ga_{(1-x3)}As$ upper second cladding layer on a GaAs compound semiconductor substrate in this order, wherein the active layer is selected from the group of layers consisting of a single layer of $In_{x2}Ga_{(1-x2)}P$, a composite layer of $In_{x3}Ga_{(1-x3)}P$ and $In_{x4}(Ga_{y4}Al_{(1-y4)})_{(1-x4)}P$ or a composite layer of $In_{x5}(Ga_{y5}Al_{(1-y5)})_{(1-x5)}P$ and $In_{x6}(Ga_{y6}Al_{(1-y6)})_{(1-x6)}P$;

a step of forming a strip-shaped mask layer of an insulating material on the upper second cladding layer;

providing zinc in the mask layer;

a step of re-forming the upper second cladding layer into a ridge shape using the mask layer;

a step of making a current blocking layer selectively grow on both sides of the ridge-shaped upper second cladding layer, wherein the current blocking layer is a single layer of GaAs, $Ga_{y9}Al_{(1-y9)}As$, $In_{x10}(Ga_{y10}Al_{(1-y10)})_{(1-x10)}P$ or $In_{x11}Al_{(1-x11)}P$, or a composite layer including a lower layer of $Ga_{y9}Al_{(1-y9)}As$, $In_{x10}(Ga_{y10}Al_{(1-y10)})_{(1-x10)}P$ or $In_{x11}Al_{(1-x11)}P$ disposed on the compound semiconductor substrate side, and an upper layer of GaAs disposed on the contact layer side;

a step of removing the mask layer with at least a portion in a vicinity of one end thereof in a longitudinal direction of the mask layer being left; and a step of forming, on the upper second cladding layer, a GaAs contact layer which is in ohmic contact with the upper second cladding layer.

* * * * *

UNITED STATES PATENT AND TRADEMARK OFFICE
CERTIFICATE OF CORRECTION

| | | |
|---|---|---|
| PATENT NO. | : 7,116,692 B2 | Page 1 of 1 |
| APPLICATION NO. | : 10/315191 | |
| DATED | : October 3, 2006 | |
| INVENTOR(S) | : Takashi Kimura et al. | |

It is certified that error appears in the above-identified patent and that said Letters Patent is hereby corrected as shown below:

IN THE CLAIMS

Claim 1, column 14, lines 21 and 22, delete second occurrence of "or a composite layer including a lower layer of $Al_{y3}Ga_{(1-y3)}$ As";

Claim 3, column 14, line 52, after "in a vicinity" insert --of at least one of a laser emission end face and a reflective end face, which --;

Claim 3, column 15, line 3, change "$In_{x1}Al_{(1-x11)}P$" to --$In_{x11}Al_{(1-x11)}P$ --;

Claim 8, column 15, line 59, change "doping zinc to a insulating material" to --doping zinc to an insulating material--;

Claim 18, column 18, line 49, after "direction of the mask layer being left" insert --, the portion left containing zinc so include a zinc diffusion source layer --.

Signed and Sealed this

Fifteenth Day of May, 2007

JON W. DUDAS
*Director of the United States Patent and Trademark Office*

(12) EX PARTE REEXAMINATION CERTIFICATE (6790th)
United States Patent
Kimura et al.

(10) Number: US 7,116,692 C1
(45) Certificate Issued: Apr. 28, 2009

(54) SEMICONDUCTOR LASER AND METHOD OF PRODUCING THE SAME

(75) Inventors: Takashi Kimura, Kyoto (JP); Hisayoshi Kitajima, Kyoto (JP)

(73) Assignee: Rohm Co., Ltd., Ukyo-Ku, Kyoto (JP)

Reexamination Request:
No. 90/008,669, May 31, 2007

Reexamination Certificate for:
Patent No.: 7,116,692
Issued: Oct. 3, 2006
Appl. No.: 10/315,191
Filed: Dec. 10, 2002

Certificate of Correction issued May 15, 2007.

(30) Foreign Application Priority Data

Dec. 11, 2001 (JP) .................................... 2001-377445
Dec. 11, 2001 (JP) .................................... 2001-377444

(51) Int. Cl.
*H01S 3/00* (2006.01)

(52) U.S. Cl. ........................... 372/46.01; 372/50.1
(58) Field of Classification Search ............. None
See application file for complete search history.

(56) References Cited

U.S. PATENT DOCUMENTS 6,261,855 B1 * 7/2001 Suzuki ..................... 438/23
6,426,967 B1   7/2002 Tanabe

FOREIGN PATENT DOCUMENTS

| JP | 60147190 A | * | 8/1985 |
| JP | 01010668 A | * | 1/1989 |
| JP | 11-346033 |   | 12/1999 |
| JP | 2000-22262 |   | 1/2000 |
| JP | 2001-223438 |   | 8/2001 |

* cited by examiner

*Primary Examiner*—Deandra M Hughes

(57) ABSTRACT

A semiconductor laser device having a lower cladding layer, an active layer and an upper first cladding layer stacked on a compound semiconductor substrate in this order, a ridge-shaped upper second cladding layer provided on the upper first cladding layer, a current blocking layer provided on both sides of the upper second cladding layer, and a contact layer provided on the upper second cladding layer. A current interrupting layer or layers formed of an insulating material are provided between the upper second cladding layer and the contact layer, in the vicinity of at least one of a laser emission end face and a reflective end face, which are both end faces of the device in the longitudinal direction of the upper second cladding layer.

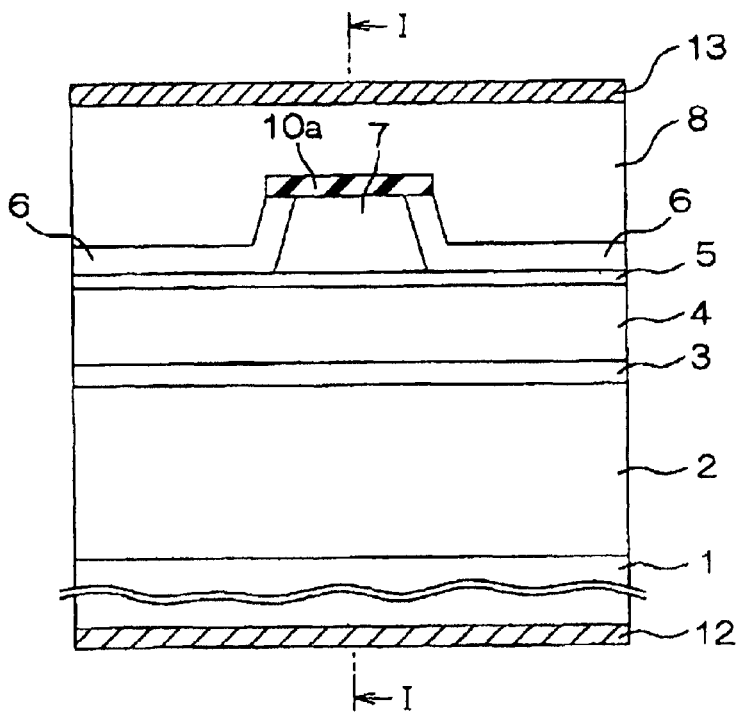

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–18 is confirmed.

New claim 19 is added and determined to be patentable.

1. A semiconductor laser device, comprising:
an $Al_{x1}Ga_{(1-x1)}$ As lower cladding layer,
an active layer selected from the group of layers consisting of a single layer of $Al_{y1}Ga_{(1-y1)}$ As, a composite layer of $Al_{y11}Ga_{(1-y11)}$ As and $Al_{y12}Ga_{(1-y12)}$ As, and a composite layer of $Al_{y1}Ga_{(1-y1)}$As and GaAs
and an $Al_{x2}Ga_{(1-x2)}$ As upper first cladding layer stacked on a GaAs compound semiconductor substrate;
an $Al_{x3}Ga_{(1-x3)}$ As ridge-shaped upper second cladding layer provided on the upper first cladding layer;
a current blocking layer provided on both sides of the upper second cladding layer, wherein the current blocking layer is a single layer of $Al_{y2}Ga_{(1-y2)}$ As or a composite layer including a lower layer of $Al_{y3}Ga_{(1-y3)}$ As disposed on the compound semiconductor susbtrate side and an upper layer of GaAs disposed on the contact layer side;
a GaAs contact layer provided on the upper second cladding layer; and
a current interrupting layer or layers formed of an insulating material and provided between the upper second cladding layer and the contact layer, in a vicinity of at least one of a laser emission end face and a reflective end face, which are both end faces of the device in a longitudinal direction of the upper second cladding layer.

*19. A semiconductor laser device according to claim 1, in which the current interrupting layer is formed of silicon oxide or silicon nitride.*

\* \* \* \* \*